United States Patent
Dostalik, Jr.

(10) Patent No.: US 7,192,880 B2
(45) Date of Patent: Mar. 20, 2007

(54) METHOD FOR LINE ETCH ROUGHNESS (LER) REDUCTION FOR LOW-K INTERCONNECT DAMASCENE TRENCH ETCHING

(75) Inventor: William W. Dostalik, Jr., Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 169 days.

(21) Appl. No.: 10/952,188

(22) Filed: Sep. 28, 2004

(65) Prior Publication Data

US 2006/0068594 A1  Mar. 30, 2006

(51) Int. Cl.
*H01L 21/302* (2006.01)
*H01L 21/461* (2006.01)

(52) U.S. Cl. .............. 438/736; 257/E21.024; 257/E21.577

(58) Field of Classification Search ........... 438/736; 257/E21.024, E21.577, E21.579
See application file for complete search history.

(56) References Cited

U.S. PATENT DOCUMENTS

| | | | |
|---|---|---|---|
| 5,981,398 A * | 11/1999 | Tsai et al. ............... 438/710 |
| 6,284,149 B1 * | 9/2001 | Li et al. ................. 216/64 |
| 2003/0052086 A1 * | 3/2003 | Mizumura et al. ......... 216/63 |
| 2003/0164354 A1 * | 9/2003 | Hsieh et al. ............. 216/22 |
| 2003/0232505 A1 * | 12/2003 | Lazar et al. ............. 438/714 |
| 2005/0079706 A1 * | 4/2005 | Kumar et al. ............ 438/638 |
| 2006/0019491 A1 * | 1/2006 | Soda .................... 438/638 |

* cited by examiner

*Primary Examiner*—Caridad Everhart
(74) *Attorney, Agent, or Firm*—Peter K. McLarty; W. James Brady, III; Frederick J. Telecky, Jr.

(57) ABSTRACT

The present invention provides a method for etching a substrate 100. The method includes conducting a first etch on an anti-reflective layer 170 and a portion of a hardmask layer 140, 150 to form an opening 162 in the substrate 100. The first etch is designed to be selective to a remaining portion of the hardmask layer 140, 150. A second etch, which is different from the first etch, is conducted on a remaining portion of the hardmask 140, 150, and it is designed to be less selective than the first etch to the remaining portion of the hardmask 140, 150. The first etch allows polymer to build up on the sidewalls of the opening 162, and the polymer substantially remains on the sidewalls during the second etch.

33 Claims, 3 Drawing Sheets

METHOD FOR LINE ETCH ROUGHNESS (LER) REDUCTION FOR LOW-K INTERCONNECT DAMASCENE TRENCH ETCHING

TECHNICAL FIELD OF THE INVENTION

The present invention is directed, in general, to etching of a semiconductor substrate and, more specifically, to a method for etching damascene trenches with reduced line edge roughness.

BACKGROUND OF THE INVENTION

Integrated circuits are mass produced by fabricating hundreds of identical circuit patterns on a single semiconductor wafer. One of the many different processes repeated over and over in manufacturing these integrated circuits is that of using a mask and etchant for forming a particular feature. In such a mask and etching process, a photo mask containing the pattern of the structure to be fabricated is created. Then, after formation of a material layer within which the feature is to be formed, the material layer is coated with a light-sensitive material called photoresist or resist. The resist-coated material layer is then exposed to ultraviolet light through the mask and developed, thereby transferring the pattern from the mask to the resist. The wafer is then etched to remove the material layer unprotected by the resist, and then the remaining resist is stripped. This masking process permits specific areas of the material layer to be formed to meet the desired device design requirements.

The semiconductor industry has steadily reduced the dimensions of transistors in integrated circuits, resulting in increased transistor density and circuit functionality. As these dimensions are decreased from one manufacturing generation to the next, some processes may need to change to accommodate the smaller dimensions.

One important example is the photolithography process. When the dimensions of the transistor or the conductors connecting the transistors fall below the ability of the photolithography light source to resolve them, then the photolithography process must transition to a light source with a shorter wavelength. This transition will in general require a new photoresist, and may require a new anti-reflective coating (ARC) and dielectric layers under the ARC.

One property of a photoresist is the roughness of the edge of the features defined in it after exposure and development. This property is referred herein as line edge roughness (LER). When a new photoresist is introduced, the LER may be significant. LER is determined in part by the chemistry of the photoresist, and may be reduced by photoresist manufacturers as the photoresist technology matures. However, maturation of a particular photoresist chemistry may be long compared to the design cycle of the industry, forcing manufacturers to go to production with a resist that has not yet been fully optimized with respect to LER.

Because the features to be etched into the semiconductor substrate are transferred from the photoresist, LER in the resist will transfer to LER of the finished conducting feature. Roughness in an interconnect line is undesirable because it results in higher and less uniform resistance, and decreased reliability of the completed semiconductor device.

Accordingly, what is needed in the semiconductor art is a dielectric etch process that reduces LER.

SUMMARY OF THE INVENTION

To address the above-discussed deficiencies of the prior art, the present invention provides a method for etching a substrate, and a method for forming an integrated circuit using the method. In one embodiment, the method for etching a substrate includes conducting a first etch on an anti-reflective layer and a portion of a hardmask layer to form an opening in the substrate. The first etch is designed to be selective to a remaining portion of the hardmask layer. A second etch, which is different from the first etch, is conducted on a remaining portion of the hardmask, and it is designed to be less selective than the first etch to the remaining portion. The first etch allows polymer to build up on the sidewalls of the opening, and the polymer substantially remains on the sidewalls during the second etch.

In another embodiment, there is provided a method for forming an integrated circuit. In one embodiment, the method includes forming transistors over a semiconductor substrate and forming a first dielectric layer over the transistor. A hardmask is deposited over the dielectric layer, and an anti-reflective layer is formed on the hardmask. A first etch is conducted on the anti-reflective layer and a portion of the hardmask layer to form an opening therein. The first etch is designed to be selective to a remaining portion of the hardmask layer. A second etch, which is different from the first etch, is conducted on the remaining portion of the hardmask. The second etch is chosen such that is less selective than the first etch to the remaining portion. The first etch allows polymer to build up on the sidewalls of the opening, and the polymer substantially remains on the sidewalls during the second etch. The method further includes forming additional dielectric layers over the first dielectric layer, and forming interconnects in the first dielectric layer and the additional dielectric layers to interconnect the transistors and thereby form an operative integrated circuit.

In yet another embodiment, a first etch is conducted on an anti-reflective layer and a portion of a hardmask layer to form an opening therein. The first etch preferably has a first etch rate modulator associated therewith and is selective to a remaining portion of the hardmask layer. A second etch, which is different from the first etch, is conducted on a remaining portion of the hardmask. The second etch has a second etch rate modulator associated therewith and is less selective than the first etch to the remaining portion. The first etch allows polymer to build up on the sidewalls of the opening, and the polymer substantially remains on the sidewalls during the second etch.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descrip tions taken in conjunction with the accompanying drawings, in which.

DETAILED DESCRIPTION

Figure 1:
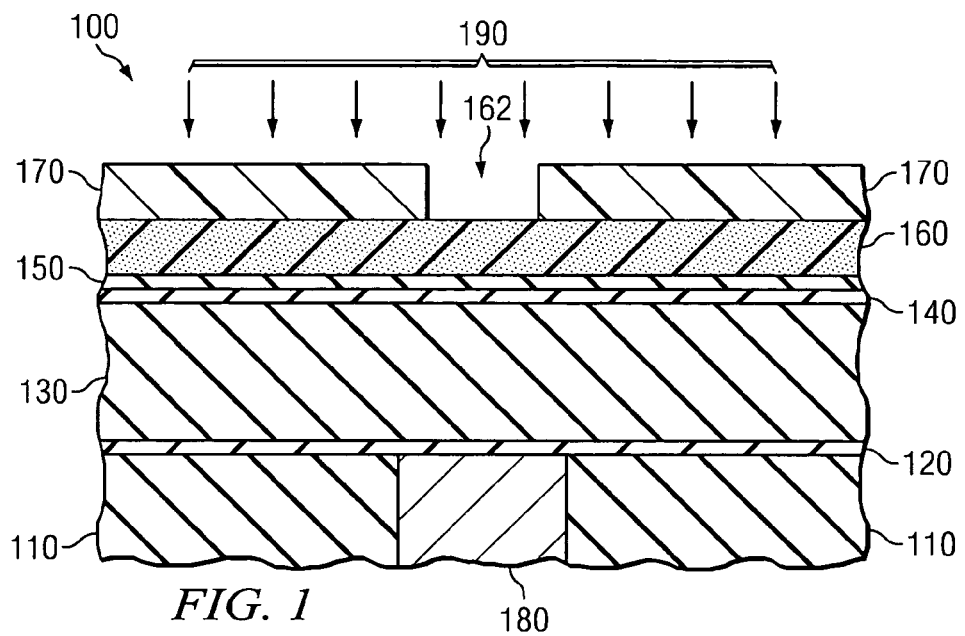
FIG. 1 illustrates a sectional view of a semiconductor substrate as it would appear at the beginning of etch processing according to the claimed invention.

Referring initially to FIG. 1, illustrated is a sectional view of a semiconductor substrate 100 processed to the point immediately before etching the substrate according to the claimed invention, as etch processing begins. Dielectric layer 110 is the intermetal dielectric (IMD) for the interconnect level immediately preceding the interconnect level to be processed according to the claimed invention. Conductor 180 is embedded in the IMD 110, and may include copper and diffusion barrier layers. Those skilled in the art will recognize that conductor 180 may be an interlevel via or an intralevel trace, depending on the details of the integrated fabrication process. FIG. 1 shows the general case for which one or more interconnect levels have completed processing, though the claimed method could also be applied to the first interconnect level. In that case, dielectric 110 would be the dielectric spacing the transistors from the first interconnect level, and conductor 180 would be a contact, possibly formed from tungsten, to an electrical component such as a transistor device.

Dielectric layer 130 is the IMD for the current interconnect level being fabricated and is separated from dielectric layer 110 and conductor 180 by diffusion barrier 120, which may be conventionally deposited silicon nitride, silicon carbide, or other suitable material. Dielectric layer 130 may be one or more layers of the same or different dielectric materials, depending on the specifics of the interconnect design. Dielectric 130 may be a conventional (silicon dioxide) dielectric or may be of the class of dielectrics known as "low-k" or "ultra low-k" dielectrics, which may comprise siloxane, silsesquioxane (SSQ)-based materials, e.g., MSQ (methylsilsesquioxane) or hydrogensilsesquioxane (HSQ), silica-based materials, e.g., carbon-or fluorine-doped silica glasses, organic-polymer-based materials, amorphous-carbon-based materials, and any other dielectric material that exhibits low or ultra low-k characteristics, and may additionally be porous. For the purposes of this invention, low-k dielectrics have a dielectric permittivity less than about 3.9, which is the dielectric constant of plasma-deposited silicon dioxide, and ultra low-k materials have a dielectric constant less than about 2.6.

Overlying dielectric 130 in FIG. 1 is a conventionally deposited lower hardmask 140 and upper hardmask 150 used to aid in the photolithographic process, and may further act to protect the dielectric layer 130 during polishing processes subsequent to the etch of the current level. Those skilled in the art will recognize that depending on the integrated fabrication process, only a single hardmask may be needed, in which case upper hardmask 150 would not be present. This option is within the scope of the present invention, as is the option of using three or more hardmask layers if required by the integrated fabrication process. The case of a two-layer hardmask is shown in FIG. 1 with upper hardmask 150 overlying lower hardmask 140. The choice of hardmask materials and thicknesses is dictated by the specific requirements of the integrated fabrication process, and by performance requirements for the finished integrated circuit. As an example, lower hardmask 140 may be a about 30 nm layer of conventionally deposited plasma silicon nitride, and upper hardmask 150 may be a about 5 nm layer of conventionally deposited plasma silicon dioxide. These materials and thicknesses are exemplary and are not intended to limit the scope of the invention.

An anti-reflective coating (ARC) 160 is used to optically match the substrate to the exposure source used in the photolithography process, and may be a commercially available spin-on organic material. Photoresist 170 is deposited onto ARC 160, and is patterned and developed by conventional means to form opening 162. Opening 162 defines the pattern to be etched into ARC 160, hardmask layers 140 and 150, and ultimately into dielectric 130.

In an advantageous embodiment, an etch process, represented by flux 190, uses a two step etch process, which may optionally be performed in situ, to open the pattern in ARC 160 and hardmask layers 140 and 150. The first etch step etches the pattern into the ARC 160, stopping on or in the hardmask. This stopping is accomplished by tailoring the process to result in "selectivity" of the etch to the hardmask and detecting a process endpoint when the hardmask is exposed. (Selectivity refers to the resistance of a material to an etching process. The selectivity of a particular material in a particular etching process is usually defined as the etch rate of the material to be removed divided by the etch rate of the particular material. Thus, a material that is highly resistant to an etch is said to have a high selectivity.) If two or more hardmask layers are used, the etch may remove one or more hardmask layers and stop on or in a lower hardmask layer. Optionally, a lower hardmask material may be used for which the etch is more selective than the higher layers, providing improved process uniformity. If a single hardmask is used, the process can be designed to have high enough selectivity to the hardmask that the etch will stop in the hardmask, leaving a remaining portion of the hardmask to be removed by the second step.

Those skilled in the art will recognize that the etch may be carried out in any of several suitable plasma reactors. Several parameters control the properties of a plasma etch process, including plasma power, chamber pressure, constituent gases, the flow rate of these gases, and substrate temperature. The parameters to implement the disclosed process may vary depending on the plasma reactor used.

In this advantageous embodiment, the gases used include an etching gas, a polymerization gas, and an etch rate modulator. For the purposes of this invention, an etching gas is a gas that serves the primary purpose of providing the chemical species in the plasma that result in volatilization and removal of material on the surface of the substrate. A polymerization gas is a gas that serves the primary purpose of providing chemical species that results in the deposition of "polymer" on the substrate surface and the sidewall of the opening 162. Polymer refers to the solid residue deposited under certain plasma conditions that is composed of cross-linked molecular fragments of one or more of the constituent gases. It will be apparent to those skilled in the art that a gas may have both etch and polymerization characteristics, and that the selection of gases and plasma conditions will result in a plasma process with a particular set of etch and polymerization characteristics. Those skilled in the art will further recognize that a gas that provides oxidizing species and an inert carrier gas may also be used. These gases can be used to modulate the etch rate by increasing it (by use of the oxidizer) or buffering it (by dilution with the inert carrier gas). For the purposes of this invention, the combination of these gases is defined as an etch rate modulator, the properties of which are determined by the gases used and their relative concentrations in the plasma.

One method of producing selectivity in a plasma process is to balance the etch characteristic of the plasma against the polymerization characteristic of the plasma. Under these conditions, the removal of material from the substrate occurs in dynamic equilibrium with deposition of polymer on the substrate. If, for one material, the net result of the etch and polymerization characteristics result in rapid removal of that material, and for a second material, the net result is a slower removal of the second material, then the etch is selective to the second material.

The disclosed etch process uses these principles to manipulate the characteristics of the first and second steps of the process to accomplish two objectives. The first purpose is to reduce the LER of the opening in the ARC 160 and hardmask layers 140 and 150, as roughness will transfer to the dielectric during the later etch of that film. Reduction in roughness is accomplished by using an etching gas and a polymerization gas in a ratio that results in sufficient polymer deposition to sufficiently passivate the walls of the ARC opening to result in a smoothing effect. The etch is conducted at a power high enough to remove material from the bottom of opening 162, but low enough to allow polymer buildup on the sidewalls to produce the desired passivation and smoothing effect. In addition to the smoothing effect, the polymer accumulation is such that the critical dimension (CD) of the opening is reduced at the bottom of the opening 162, resulting in a smaller CD in the opening of the hardmask than the original opening in the ARC 170.

Those skilled in the art will appreciate there is a process window of etch power that will result in these desirable process characteristics. In one embodiment, an etch power between about 100 Watts and about 700 Watts will produce the desired characteristics under the additional plasma conditions discusses below. This power range results in an ARC etch rate of less than about 200 nm/min, which has the desirable effect of allowing polymer buildup on the sidewalls of the opening 162.

In one advantageous embodiment of the invention, the etching gas used in this first etch step is tetrafluoromethane at a flow rate of about 80 sccm, and the polymerization gas is difluoromethane at a flow rate of about 4 sccm. In addition, an etch rate modulator is used, which comprises argon flowing at about 240 sccm and oxygen flowing at about 15 sccm. The pressure of the chamber in this embodiment is regulated to maintain about 50 mTorr, and the plasma power is about 300 Watts. The substrate temperature is regulated to maintain about 40° C. In another embodiment, the ratio of the flow rate of tetrafluoromethane to oxygen is set to about 5.3:1, the ratio of the flow rate of difluoromethane to that of oxygen is about 1:3.7, and the ratio of the flow rate of argon to that of oxygen is about 16:1. Those skilled in the art will appreciate that the gas flows and flow ratios cited herein may vary, depending on the etch tool manufacturer and model used, and will further appreciate that these parameters may vary depending on the size of the semiconductor substrate the etch tool is designed to process.

Though the embodiment cited above produces a uniquely advantageous reduction of LER, the plasma parameters may vary from those of the embodiment discussed above and still achieve satisfactory results. The flow rate of argon may be varied from about 0 sccm to about 500 sccm. The flow rates of the other gases are at least partly dependent on the flow rate of argon in the desired process window. Over this range of argon flow, tetrafluoromethane may vary from about 20 sccm to about 100 sccm, the flow of difluoromethane may vary from about 0 sccm to about 20 sccm, and the flow rate of oxygen may vary from about 5 sccm to about 30 sccm. The chamber pressure may vary from 20 mTorr to about 100 mTorr, and as discussed previously, the power may range from about 100 Watts to about 700 Watts. Within these ranges, the plasma parameters will result in sufficient polymer formation to result in a substantially smooth edge of the ARC opening, and the etch will have sufficient selectivity to stop on or in hardmask 140.

Figure 2:
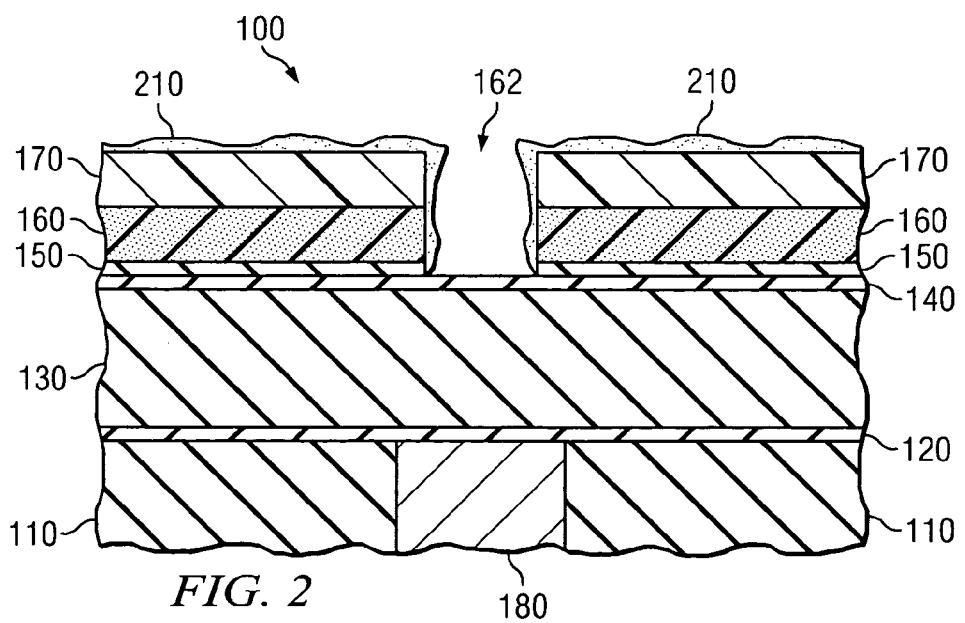
FIG. 2 illustrates a sectional view of a semiconductor substrate after completion of the first step of the etch process according to the claimed invention.

Now considering FIG. 2, shown is a sectional view of the substrate 100 after the first step of the etch process. In this Figure, polymer 210 is shown on both the surface of photoresist 170 and on the sidewalls of the opening in photoresist 170 and ARC 160. The portion of hardmask 150 exposed at the bottom of the opening has also been removed in this step, and the etch has stopped at or below the original surface of hardmask 140. If a single hardmask is used, the etch would stop in the hardmask, leaving an unetched portion remaining at the bottom of the opening 162. The polymer 210 on the surface of the photoresist 170 increases selectivity of the first etch step to the photoresist 170, substantially protecting it from the etch.

The purpose of step two of the disclosed process is to remove the remaining hardmask 140 without significant removal of the passivating polymer so that the beneficial characteristics of the polymer are maintained during this step. This objective is met by using an etch chemistry with a substantial polymerizing component, but which also has a lower selectivity to the remaining portion of the hardmask than the etch in the first step. The use of a polymerizing etch chemistry to remove the remaining portion of the hardmask is contrary to the conventional practice of the art, in which a substantially non-polymerizing etch chemistry would be used to remove the remaining portion of the hardmask. Such a "clean" chemistry would consume polymer, aiding a cleanup process that would follow the etch. However, this would have the undesired effect of increasing the line edge roughness. Moreover, the power used in the second step is also maintained at a low setting to favor the etch in the bottom of opening 162 rather than etching the sidewall. An advantageous power level would result in an etch rate of the remaining portion of the hardmask of less than about 100 nm/min. Thus, the second step of the disclosed process provides advantage over the conventional practice for the purpose of LER.

In an advantageous embodiment of the present invention the second step uses a single fluorocarbon gas, such as one with the empirical formula $C_4F_8$, as both the etching gas and the polymerization gas. In this embodiment, octofluorocyclobutane is used, though the invention may be practiced with any of the several isomers of $C_4F_8$. This gas provides a sufficient etch rate and sufficient polymerization by itself to result in a faithful transfer of the pattern to hardmask 140 without significant LER or etch of dielectric 130. In this embodiment, the flow rate of $C_4F_8$ is about 12 sccm. The etch rate modulator comprises oxygen at about 17 sccm and argon at about 150 sccm. The power, pressure and substrate temperature are held at the same values as those used in the first step, about 300 Watts, about 50 mTorr and about 40° C., respectively. In another embodiment, the ratio of the flow rate of $C_4F_8$ to oxygen is set to about 1:1.4, and the ration of the flow rate of argon to that of oxygen is set to about 8.8:1.

As in the first step, the values of the etch parameters may vary from those of the exemplary advantageous embodiment and still maintain the essential characteristics of the process. Again, as argon flow is varied, the other gas flows may vary to maintain the desired process characteristics. The flow rate of argon may vary from about 0 sccm to about 500 sccm, in which range the $C_4F_8$ may vary from about 2 sccm to about 30 sccm, and that of oxygen may vary from about 5 sccm to about 30 sccm. The power may range from about 100 Watts to about 700 Watts, and the chamber pressure may vary from 20 mTorr to about 100 mTorr.

Figure 3:
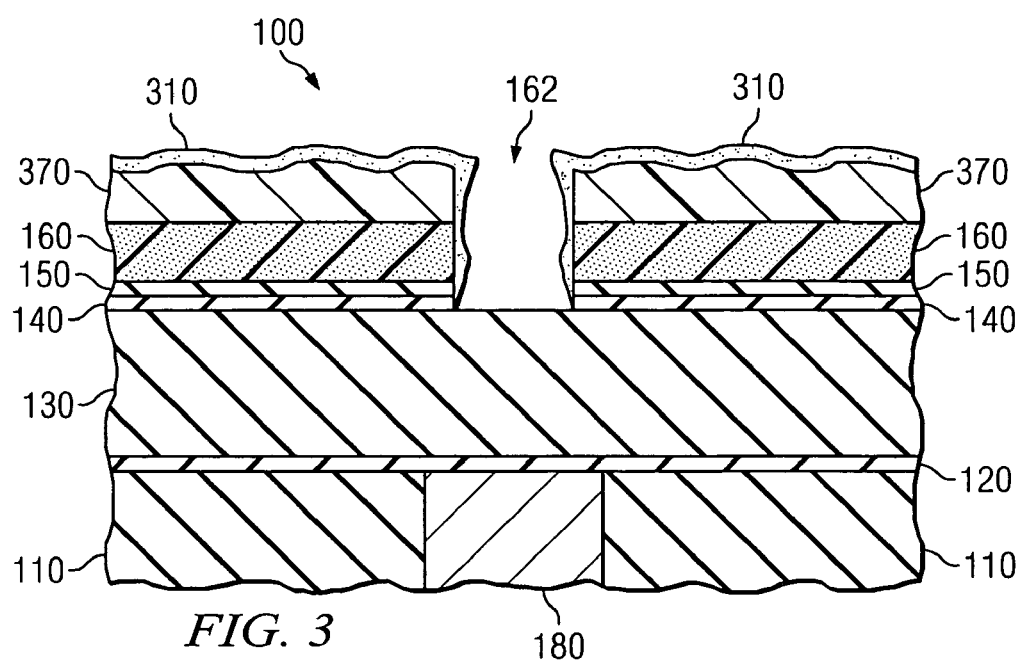
FIG. 3 illustrates a sectional view of a semiconductor substrate after completion of the second step of the etch process according to the claimed invention.

FIG. 3 shows a sectional view of substrate 100 after the second etch process. At this point, that portion of hardmask 140 exposed to the plasma has been removed, exposing dielectric 130. The plasma preferably interacts with dielectric 130 for only a brief period during which hardmask 140 is substantially removed from all open areas of the semiconductor substrate. Because the selectivity of the second step is lower than that of the first step, some photoresist 370 has been removed, and the passivating polymer 310 produced by the first step has been reduced on the surface of the photoresist 370 and on the edges of the opening 162 in the ARC 160.

Figure 4:
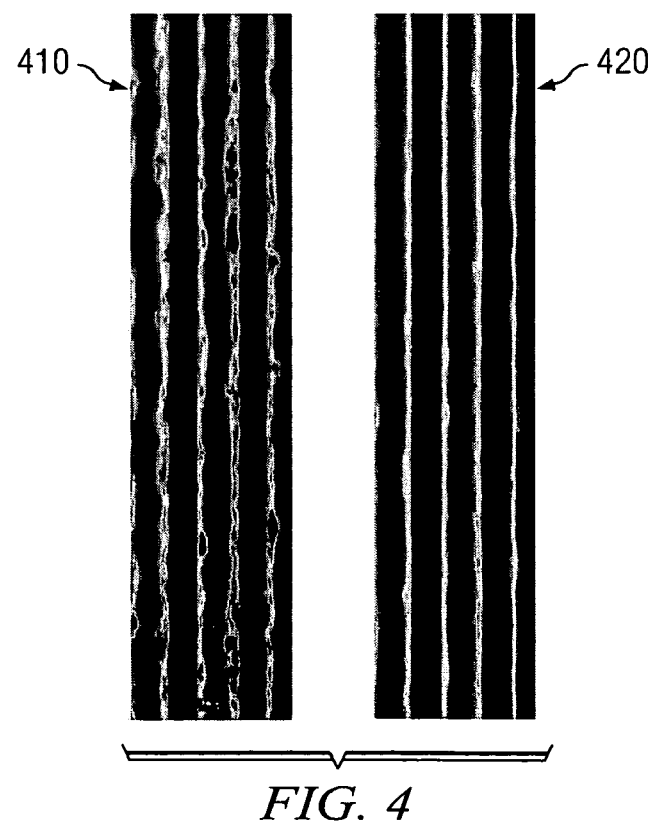
FIG. 4 shows a micrograph of trenches etched in an ARC and hardmask representative of a conventional etch process and another micrograph representative of the trenches formed according to the principles of the claimed invention.

The advantageous result of the invention is shown in FIG. 4, in which two top-down scanning electron micrograph images are shown. Micrograph 410 shows trenches etched into the ARC and hardmask layers with a one-step process that is representative of the conventional practice. The LER in this image is apparent in the micrograph at the edges of the trenches, and would result in an undesirable degree of conductor roughness. Micrograph 420 shows etched trenches that are representative of the results obtained using the disclosed invention. The significant reduction of LER in micrograph 420 relative to micrograph 410 demonstrates the advantageous nature of the invention over a conventional process in that the trenches formed by a process covered by the present invention are much smoother than the trenches formed by conventional processes. Conducting lines formed using this process will have significantly less roughness, and more desirable electrical and reliability characteristics.

Figure 5:
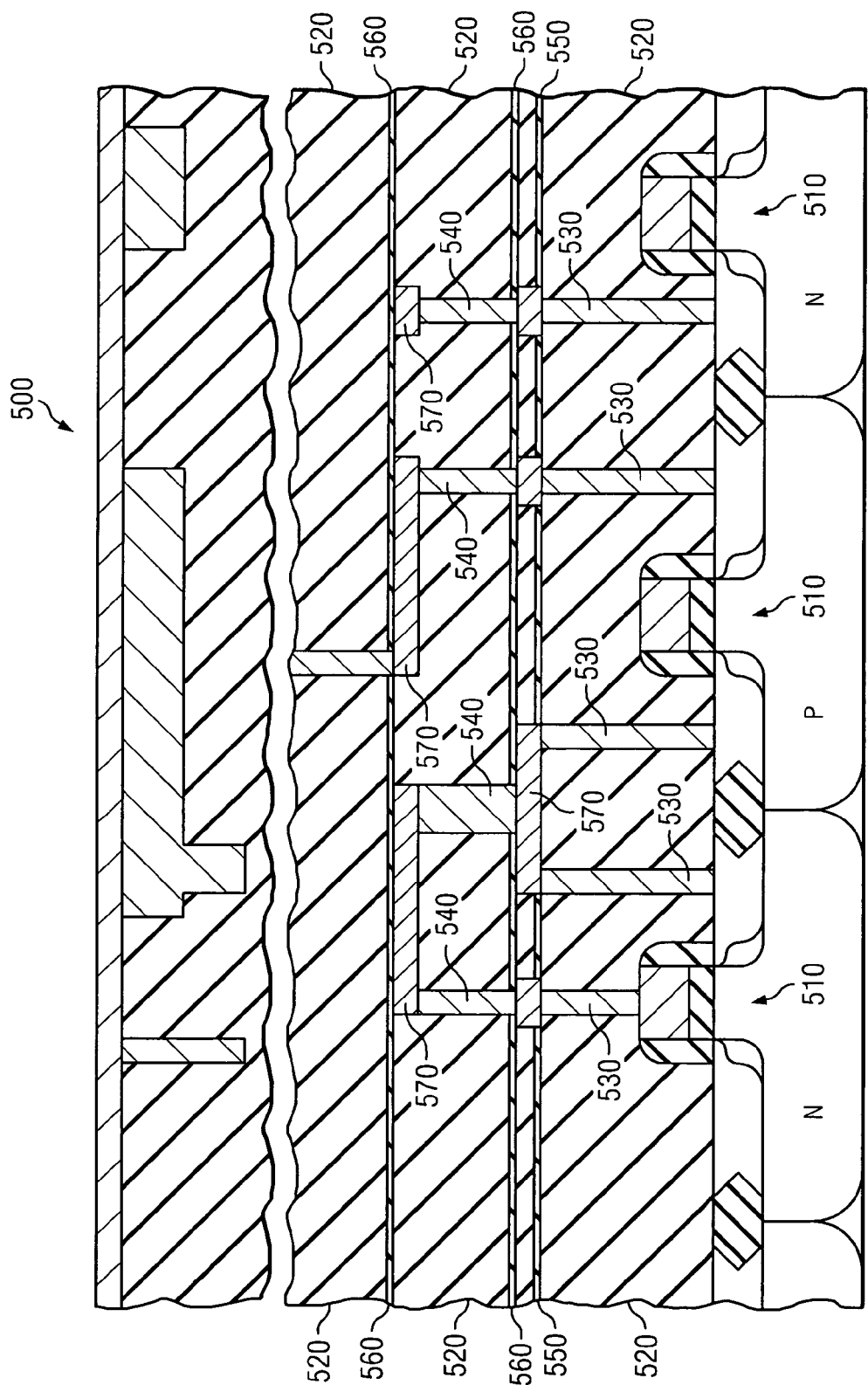
FIG. 5 illustrates a sectional view of a semiconductor device manufactured according to the principles of the claimed invention.

Referring finally to FIG. 5, illustrated is a cross-sectional view of an integrated circuit (IC) 500 incorporating semiconductor devices 510, interconnected with contacts 530, vias 540, and metal traces 570. The vias and metal traces are embedded in conventionally deposited dielectric 520, which may be single or multilayered, using one or more dielectric materials, which may be low-k or ultra low-k dielectrics. Diffusion barrier 560 overlies dielectric 520 and metal lines, and may comprise conventionally deposited silicon nitride, silicon carbide, or other suitable dielectric material. At least one level of dielectric 520 has been processed according to the principles of the current invention to produce openings in which metal is placed for vias and/or metal traces. The IC 500 may include devices, such as transistors used to form CMOS devices, BiCMOS devices, bipolar devices, capacitors or other types of devices. The IC 500 may further include passive devices, such as inductors or resistors, or it may also include optical devices or optoelectronic devices. Those skilled in the art are familiar with these various types of devices and their manufacture. Metal traces 570 and vias 530 are used to connect the various devices to form the operational IC 500.

The interconnect architecture of the IC 500 is exemplary of one that may be fabricated according to the principles of the invention. It will be apparent to one skilled in the art that several variations of the exemplary interconnect architecture may be fabricated according to the principles of the invention with similarly advantageous results.

Although the present invention has been described in detail, those skilled in the art should understand that they can make various changes, substitutions and alterations herein without departing from the spirit and scope of the invention in its broadest form.

What is claimed is:

1. A method for etching a substrate, comprising:
    conducting a first etch on an anti-reflective layer and a portion of a hardmask layer to form an opening therein, the first etch being selective to a remaining portion of the hardmask layer;
    conducting a second etch different from the first etch on the remaining portion, the second etch being less selective than the first etch to the remaining portion, wherein the first etch allows a build-up of polymer on the side walls of the opening and the polymer substantially remains on the side walls during the second etch; and
    wherein the first etch comprises a mixture of gases having an etching gas, a polymerization gas, and a first etch rate modulator and wherein the second etch comprises a fluorocarbon gas that is both an etching gas and a polymerization gas under a same set of etching parameters and a second etch rate modulator.

2. The method as recited in claim 1 wherein the etch rate of the first etch is less than about 200 nm/mm, and the etch rate of the second etch is less than about 100 nm/mm.

3. The method as recited in claim 1 wherein the hardmask layer is a silicon dioxide layer located over a silicon nitride layer.

4. The method as recited in claim 1 wherein a critical dimension of the opening in the hard mask is less than a critical dimension of the opening in the anti-reflective layer.

5. The method as recited in claim 1 wherein a flow rate of the etching gas ranges from about 20 sccm to about 100 sccm, a flow rate of the polymerization gas ranges from about 0 sccm to about 20 sccm, a flow rate of the first etch rate modulator ranges from about 5 sccm to about 530 sccm, a flow rate of the fluorocarbon gas ranges from about 2 scorn to about 30 sccm, and a flow rate of the second etch rate modulator ranges from about 5 sccm to about 530 sccm.

6. The method as recited in claim 5 wherein the tetrafluoromethane has a flow rate ranging from about 20 sccm to about 100 sccm, the difluoromethane has a flow rate ranging from about 0 sccm to about 20 sccm, the $C_4F_8$ has a flow rate ranging from about 2 sccm to about 30 sccm, the first etch rate modulator is a mixture of argon and oxygen wherein a first flow rate of the argon ranges from about 0 sccm to about 500 sccm, and a first flow rate of the oxygen ranges from about 5 sccm to about 30 sccm, and the second etch rate modulator is a mixture of argon and oxygen wherein a second flow rate of the argon ranges from about 0 sccm to about 500 sccm and a second flow rate of the oxygen ranges from about 5 sccm to about 30 sccm.

7. The method as recited in claim 6 wherein the flow rate of the tetrafluoromethane is about 80 sccm, the flow rate of the difluoromethane is about 4 sccm, the flow rate of $C_4F_8$ is about 12 sccm, the first flow rate of the oxygen is about 15 sccm, the first flow rate of the argon is about 240 sccm, the second flow rate of the oxygen is about 17 sccm, and the second flow rate of the argon is about 150 sccm.

8. The method as recited in claim 1 wherein the etching gas comprises tetrafluoromethane, the polymerization gas comprises difluoromethane, the fluorocarbon gas comprises $C_4F_8$, and the first and second etch rate modulators are each a mixture of argon and oxygen.

9. The method as recited in claim 8 wherein the ratio of a flow rate of tetrafluoromethane to a flow rate of oxygen is about 5.3:1, the ratio of a flow rate of difluoromethane to the flow rate of oxygen is about 1:3.7, the ratio of a flow rate of $C_4F_8$ to the flow rate of oxygen is about 1:1.4, the ratio of a first flow rate of argon to the flow rate of oxygen in the first etch rate modulator is about 16:1, and a second ratio of the flow rate of argon to the flow rate of oxygen in the second etch rate modulator is about 8.8:1.

10. The method as recited in claim 1 wherein a power of the first and second etches ranges from about 100 Watts to about 700 Watts and a pressure of the first and second etches range from about 20 mTorr to about 100 mTorr and at a substrate temperature of about 40 EC.

11. The method as recited in claim 10 wherein the power is about 300 Watts and the pressure is about 50 mTorr.

12. The method as recited in claim 1 wherein said substrate is a dielectric material and wherein at least a portion of the dielectric layer has a dielectric constant less than about 3.9.

13. The method as recited in claim 12 wherein the dielectric layer is a carbon doped glass.

14. A method for manufacturing an integrated circuit, comprising:
   forming transistors over a semiconductor substrate;
   forming a first dielectric layer over the transistor;
   depositing a hardmask on the dielectric layer;
   placing an anti-reflective layer on the hardmask; conducting a first etch on an anti-reflective layer and a portion of a hardmask layer to form an opening therein, the first etch being selective to a remaining portion of the hardmask layer;
   conducting a second etch different from the first etch on the remaining portion, the second etch being less selective than the first etch to the remaining portion, wherein the first etch allows a build-up of polymer on the side walls of the opening and the polymer substantially remains on the side walls during the second etch;
   forming additional dielectric layers over the first dielectric layer;
   forming interconnects with the first dielectric layer and the additional dielectric layers to interconnect the transistors and thereby form an operative integrated circuit; and
   wherein the first etch comprises a mixture of gases having an etching gas, a polymerization gas, and a first etch rate modulator and wherein the second etch comprises a fluorocarbon gas that is both an etching gas and a polymerization gas under a same set of etching parameters and a second etch rate modulator.

15. The method as recited in claim 14 wherein the hardmask layer is a silicon dioxide layer located over a silicon nitride layer.

16. The method as recited in claim 14 wherein a critical dimension of the opening in the hardmask is less than a critical dimension of the opening in the anti-reflective layer.

17. The method as recited in claim 14 wherein the etch rate of the first etch is less than about 200 nm/mm, and the etch rate of the second etch is about 100 nm/mm.

18. The method as recited in claim 17 wherein the etching gas comprises tetrafluoromethane, the polymerization gas comprises difluoromethane, the fluorocarbon gas comprises $C_4F_8$, and the first and second etch rate modulators are each a mixture of argon and oxygen.

19. The method as recited in claim 18 wherein the ratio of a flow rate of tetrafluoromethane to a flow rate of oxygen is about 5.3:1, the ratio of a flow rate of difluoromethane to the flow rate of oxygen is about 1:3.7, the ratio of a flow rate of $C_4F_8$ to the flow rate of oxygen is about 1:1.4, the ratio of a first flow rate of argon to the flow rate of oxygen in the first etch rate modulator is about 16:1, and a second ratio of the flow rate of argon to the flow rate of oxygen in the second etch rate modulator is about 8.8:1.

20. The method as recited in claim 14 wherein a flow rate of the etching gas ranges from about 20 sccm to about 100 sccm, a flow rate of the polymerization gas ranges from about 0 sccm to about 20 sccm, a flow rate of the first etch rate modulator ranges from about 5 sccm to about 530 sccm, a flow rate of the fluorocarbon gas ranges from about 2 sccm to about 30 sccm, and a flow rate of the second etch rate modulator ranges from about 5 sccm to about 530 sccm.

21. The method as recited in claim 20 wherein the etching gas is tetrafluoromethane that has a flow rate ranging from about 20 sccm to about 100 sccm, the polymerization gas is difluoromethane that has a flow rate ranging from about 0 sccm to about 20 sccm, the fluorocarbon is $C_4F_8$ that has a flow rate ranging from about 2 sccm to about 30 sccm, the first etch rate modulator is a mixture of argon and oxygen wherein a first flow rate of the argon ranges from about 0 sccm to about 500 sccm, and a first flow rate of the oxygen ranges from about 5 sccm to about 30 sccm, and the second etch rate modulator is a mixture of argon and oxygen wherein a second flow rate of the argon ranges from about 0 sccm to about 500 sccm and a second flow rate of the oxygen ranges from about 5 sccm to about 30 sccm.

22. The method as recited in claim 21 wherein the flow rate of the tetrafluoromethane is about 80 sccm, the flow rate of the difluoromethane is about 4 sccm, the flow rate of $C_4F_8$ is about 12 sccm, the first flow rate of the oxygen is about 15 sccm, the first flow rate of the argon is about 240 sccm, the second flow rate of the oxygen is about 17 sccm, and the second flow rate of the argon is about 150 sccm.

23. The method as recited in claim 14 wherein a power of the first and second etches ranges from about 100 Watts to about 700 Watts and a pressure of the first and second etches range from about 20 mTorr to about 100 mTorr and at a substrate temperature of about 40 EC.

24. The method as recited in claim 23 wherein the power is about 300 Watts and the pressure is about 50 mTorr.

25. The method as recited in claim 14 wherein said substrate is a dielectric material and wherein at least a portion of the dielectric layer has a dielectric constant less than about 3.9.

26. The method as recited in claim 25 wherein the dielectric layer is a carbon doped glass.

27. A method for etching a substrate, comprising:
   conducting a first etch on an anti-reflective layer and a portion of a hardmask layer to form an opening therein, the first etch having a first etch rate modulator associated therewith and being selective to a remaining portion of the hardmask layer on which the anti-reflective layer is located;
   conducting a second etch different from the first etch on the remaining portion, the second etch being less selective than the first etch to the remaining portion, wherein the first etch allows a build-up of polymer on the side walls of the opening and the polymer substantially remains on the side walls during the second etch; and wherein a critical dimension of the opening in the hardmask is less than a critical dimension of the opening in the anti-reflective layer.

28. The method as recited in claim 27 wherein the first etch rate modulator comprises a flow rate of about 240 sccm argon and about 15 sccm of oxygen, and the second etch rate modulator comprises a flow rate of about 150 sccm argon and about 17 sccm oxygen, and the first and second etches are conducted at about 300 Watts power and about 50 mTorr.

29. The method as recited in claim 27 wherein the hardmask layer is a silicon dioxide layer located over a silicon nitride layer.

30. The method as recited in claim 27 wherein the first and second etches are conducted at a power ranging from about 100 Watts to about 700 Watts.

31. The method as recited in claim 28 wherein the first and second etches are conducted at about 300 Watts power and about 50 mTorr.

32. The method as recited in claim 27 wherein said substrate is a dielectric material and wherein at least a portion of the dielectric layer has a low dielectric constant less than about 3.

33. The method as recited in claim 32 wherein the dielectric layer is a carbon doped glass.

* * * * *